US012610724B2

(12) United States Patent
Lee et al.

(10) Patent No.: US 12,610,724 B2
(45) Date of Patent: Apr. 21, 2026

(54) DISPLAY DEVICE

(71) Applicant: Samsung Display Co., LTD., Yongin-si (KR)

(72) Inventors: Juhyun Lee, Yongin-si (KR); Hyuneok Shin, Yongin-si (KR); Junhyuk Woo, Yongin-si (KR); Taewook Kang, Yongin-si (KR); Yung Bin Chung, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 447 days.

(21) Appl. No.: 18/235,253

(22) Filed: Aug. 17, 2023

(65) Prior Publication Data

US 2024/0145635 A1     May 2, 2024

(30) Foreign Application Priority Data

Nov. 2, 2022     (KR) ........................ 10-2022-0144472

(51) Int. Cl.
*H10K 59/80*          (2023.01)

(52) U.S. Cl.
CPC ....... *H10K 59/8792* (2023.02); *H10K 59/879* (2023.02)

(58) Field of Classification Search
CPC .......................... H10K 59/8792; H10K 59/879
See application file for complete search history.

(56) References Cited

U.S. PATENT DOCUMENTS

| | | | | |
|---|---|---|---|---|
| 2021/0217831 A1* | 7/2021 | Jung | .................. | H10K 59/8792 |
| 2021/0357613 A1* | 11/2021 | Lim | .................. | G06V 40/1318 |
| 2024/0298506 A1* | 9/2024 | Lee | .................. | H10K 59/873 |
| 2024/0324425 A1* | 9/2024 | Shin | .................. | H10K 59/879 |

FOREIGN PATENT DOCUMENTS

| | | | | |
|---|---|---|---|---|
| KR | 20180002947 A | 1/2018 | | |
| KR | 20200009172 A | 1/2020 | | |
| KR | 20210032123 A | 3/2021 | | |
| KR | 20210033583 A | 3/2021 | | |
| KR | 102251840 B1 | 5/2021 | | |
| KR | 20210126839 A | 10/2021 | | |
| WO | WO-2023052922 A1 * | 4/2023 | ......... | G02B 27/0922 |

* cited by examiner

*Primary Examiner* — Mariceli Santiago
(74) *Attorney, Agent, or Firm* — CANTOR COLBURN LLP

(57)          ABSTRACT

A display device includes a substrate, a first transparent pattern disposed on the substrate, where a first opening is defined through the first transparent pattern, and a first light absorbing layer overlapping a side surface of the first transparent pattern defining the first opening, where the first light absorbing layer includes a metal oxide including a first metal element, which is selected from molybdenum (Mo), copper (Cu) and chromium (Cr), and a second metal element of Group 15, and the first light absorbing layer has a thickness in a range of about 500 Å to about 10000 Å.

20 Claims, 19 Drawing Sheets

FIG. 1
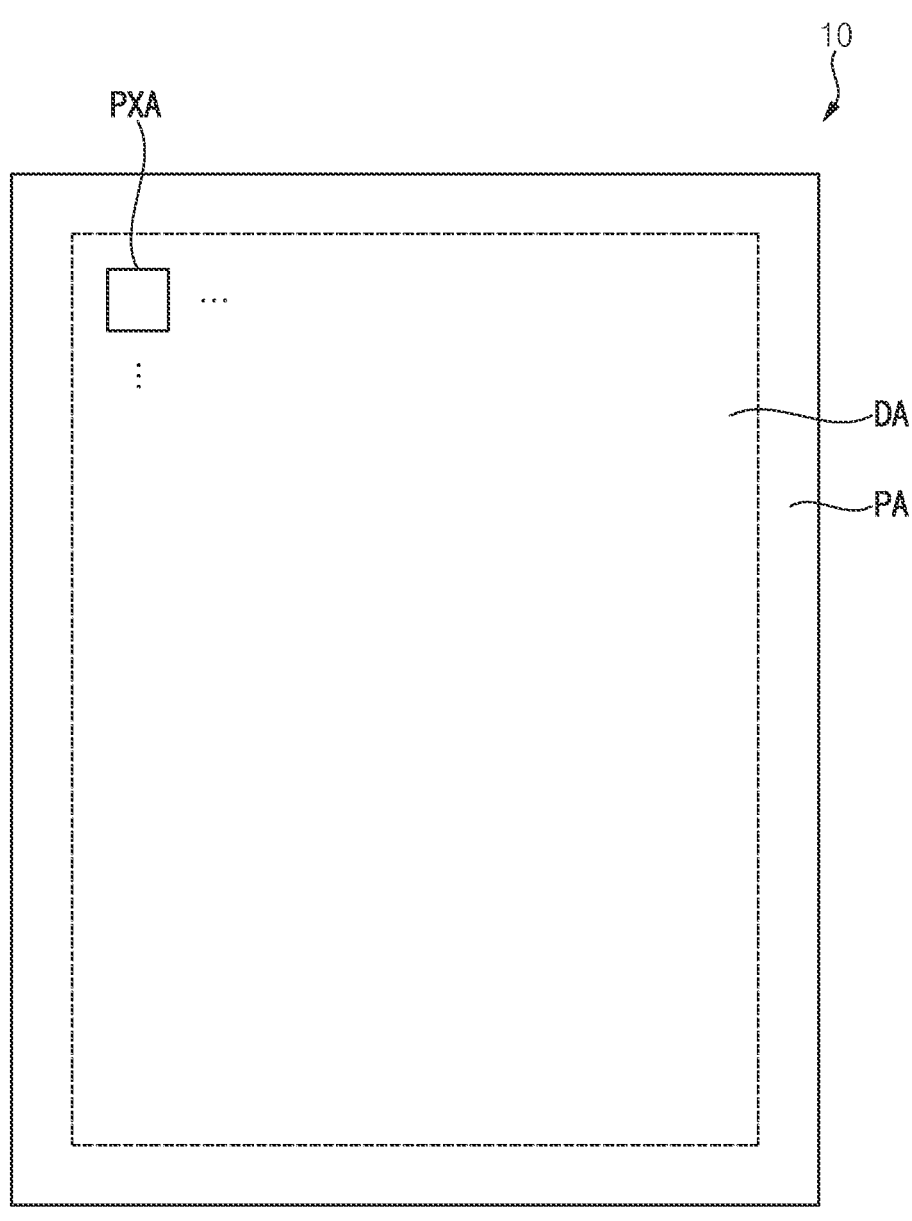
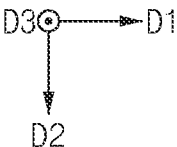

F I G. 3

FIG. 5
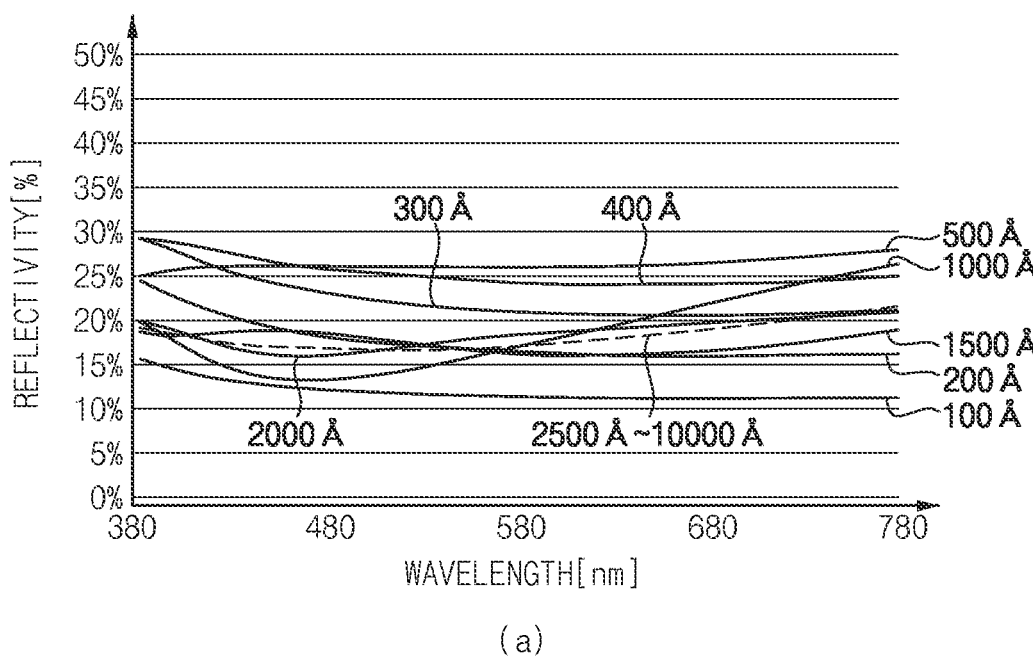
(a)
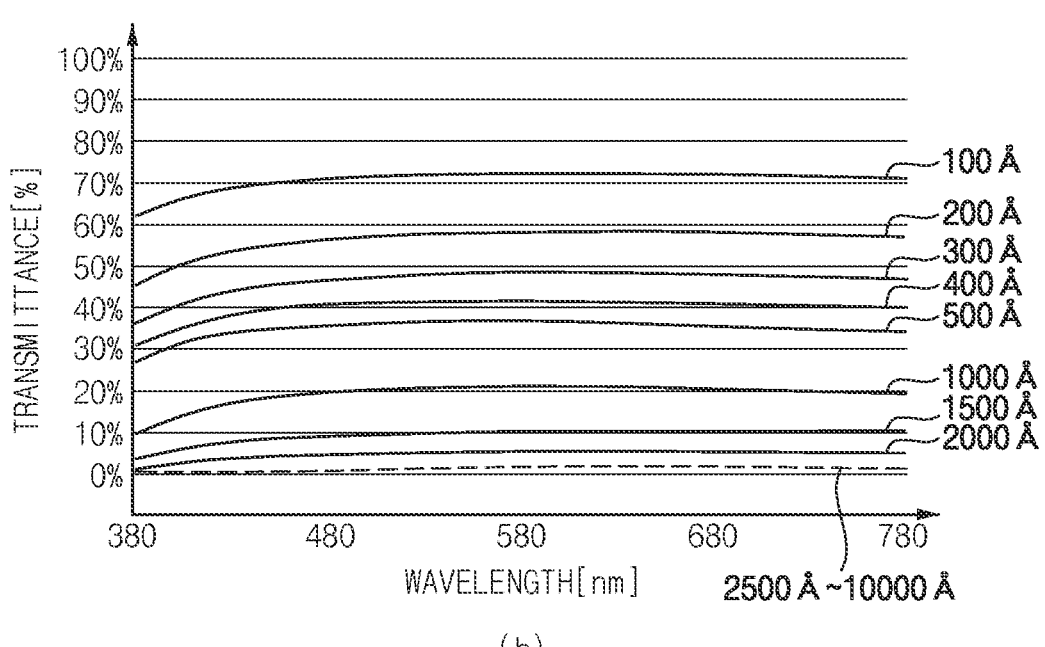
(b)

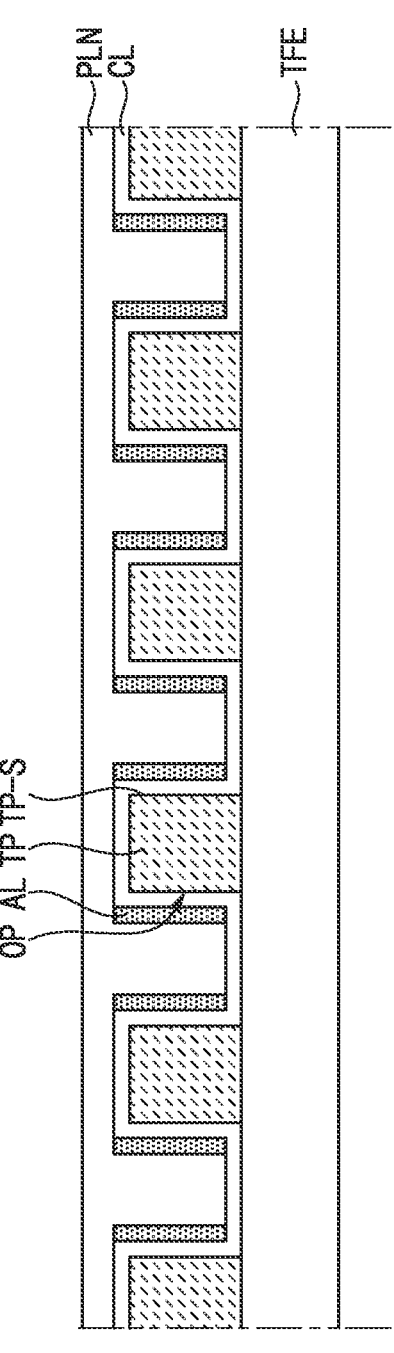
FIG. 11

F I G. 1 3
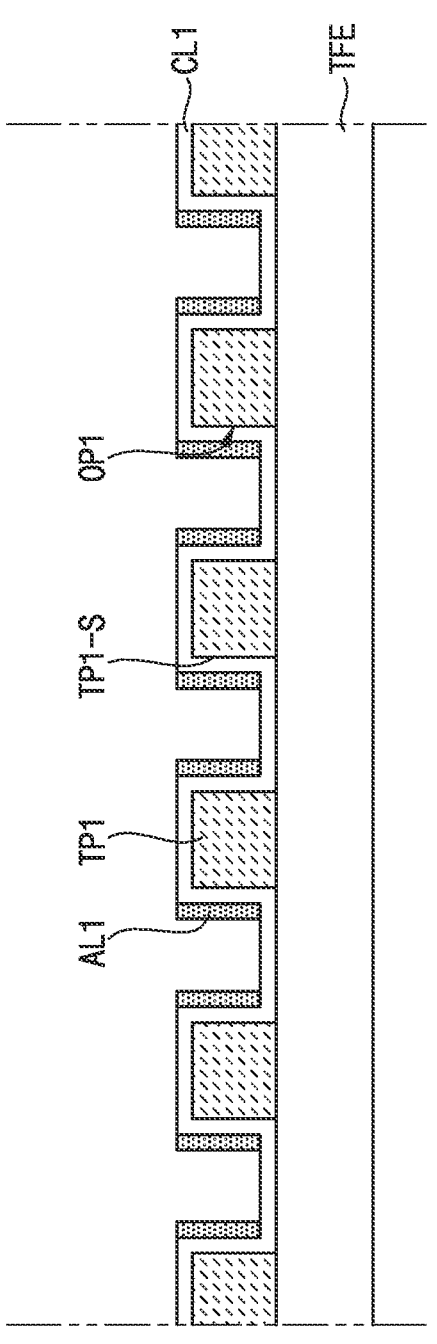

F I G . 16
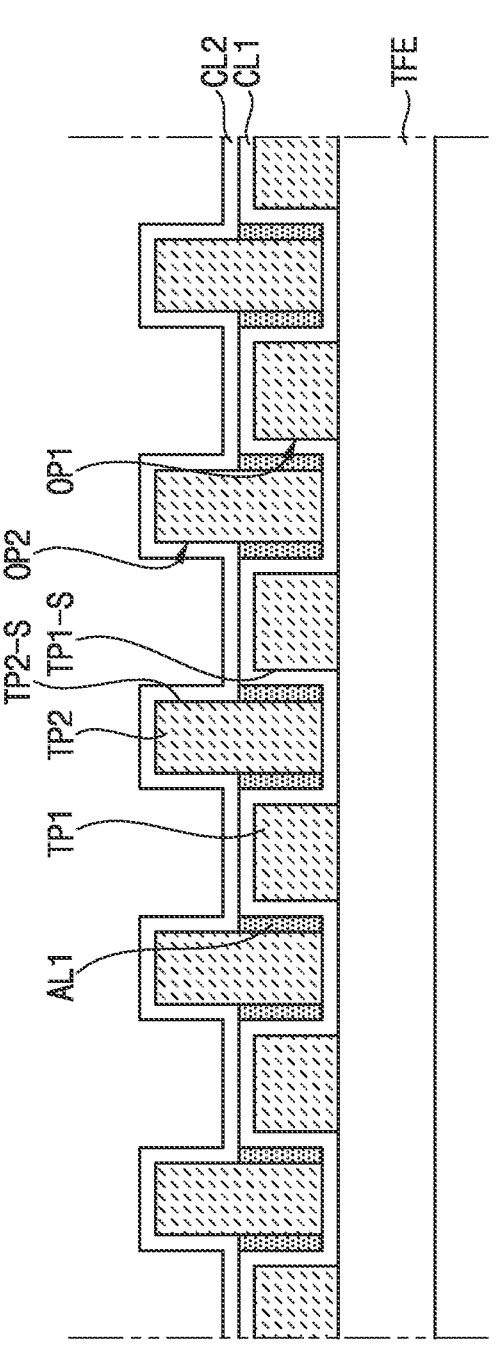

F I G . 19
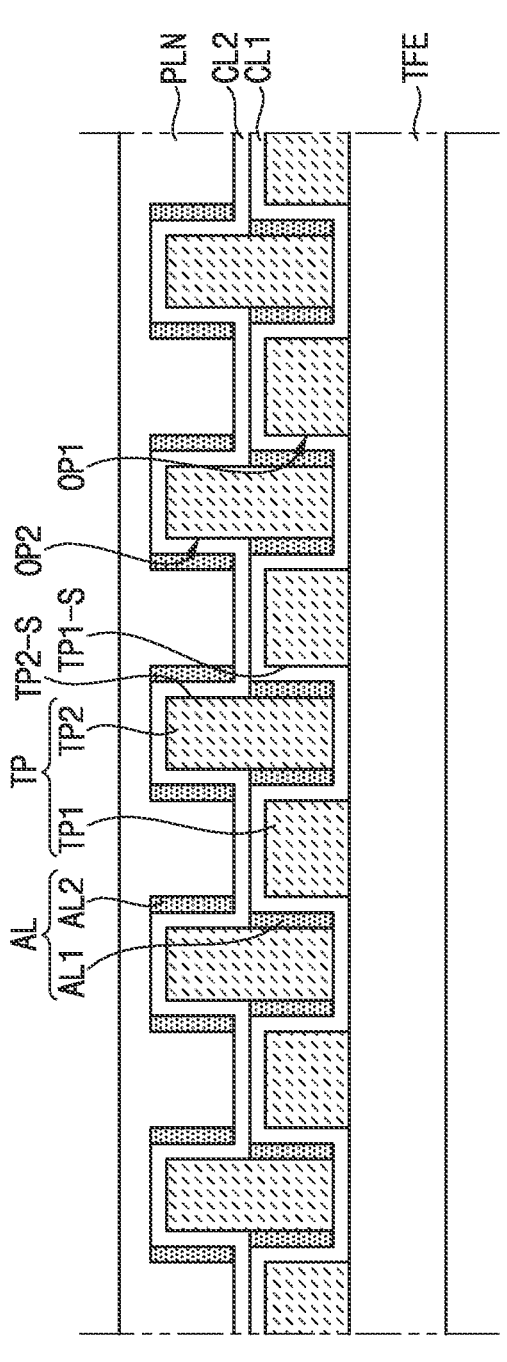

DISPLAY DEVICE

This application claims priority to Korean Patent Application No. 10-2022-0144472, filed on Nov. 2, 2022, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

The display device is a device that displays an image and includes a display area for displaying an image. Recently, demands for a display device in which a viewing angle of an image displayed in a display area is controlled is increasing.

Accordingly, a display device capable of controlling the viewing angle of an image displayed in a display area is being researched.

SUMMARY

Embodiments provide a display device that controls a viewing angle of a displayed image and has a simplified structure.

A display device according to an embodiment includes a substrate, a first transparent pattern disposed on the substrate, where a first opening is defined through the first transparent pattern, and a first light absorbing layer overlapping a side surface of the first transparent pattern defining the first opening, where the first light absorbing layer includes a metal oxide including a first metal element, which is selected from molybdenum (Mo), copper (Cu) and chromium (Cr), and a second metal element of Group 15, and the first light absorbing layer has a thickness in a range of about 500 angstrom (Å) to about 10000 Å.

In an embodiment, the second metal element may be selected from tantalum (Ta), niobium (Nb), and vanadium (V).

In an embodiment, the metal oxide included in the first light absorbing layer may be represented by the following chemical formula: $ABO_x$, where A denotes the first metal element, B denotes the second metal element, and x is 1.9 or greater and 2.9 or less.

In an embodiment, a content of the second metal element in the first light absorbing layer may be in a range of about 5 atomic percent (at %) to about 50 at % based on a total number of atoms of the first metal element, the second metal element and oxygen (O) in the first light absorbing layer.

In an embodiment, the first light absorbing layer may have a single-layer structure.

In an embodiment, a taper angle of the side surface of the first transparent pattern may be in a range of about 80 degrees to about 90 degrees.

In an embodiment, the display device may further include a first capping layer covering the first transparent pattern, and the first light absorbing layer may be disposed on the first capping layer.

In an embodiment, the metal oxide included in the first light absorbing layer may further include a third metal element of Group 14.

In an embodiment, the third metal element may be selected from titanium (Ti), zirconium (Zr), and hafnium (Hf).

In an embodiment, the metal oxide included in the first light absorbing layer may be represented by the following chemical formula: $ABCO_x$, where A denotes the first metal element, B denotes the second metal element, C denotes the third metal element, and x is 1.9 or greater and 2.9 or less.

In an embodiment, a total content of the second metal element and the third metal element in the first light absorbing layer may be in a range of about 5 at % to about 50 at % based on a total number of atoms of the first metal element, the second metal element, the third metal element, and oxygen (O) in the first light absorbing layer.

In an embodiment, the display device may further include a second transparent pattern disposed in the first opening of the first transparent pattern, where the second transparent pattern has a height greater than a height of the first transparent pattern, and a second opening is defined through the second transparent pattern, and a second light absorbing layer overlapping a side surface of the second transparent pattern defining the second opening.

In an embodiment, the second light absorbing layer may include a metal oxide including the first metal element and the second metal element, and the second light absorbing layer may have a thickness in a range of about 500 Å to about 10000 Å.

In an embodiment, the metal oxide included in the second light absorbing layer may be represented by the following chemical formula: $ABO_x$, where A denotes the first metal element, B denotes the second metal element, and x is 1.9 or greater and 2.9 or less.

In an embodiment, a content of the second metal element in the second light absorbing layer may be in a range of about 5 at % to about 50 at % based on a total number of atoms of the first metal element, the second metal element and oxygen (O) in the second light absorbing layer.

In an embodiment, the second light absorbing layer may have a single-layer structure.

In an embodiment, the metal oxide included in the second light absorbing layer further may include a third metal element of Group 14.

In an embodiment, the metal oxide included in the second light absorbing layer may be represented by the following chemical formula: $ABCO_x$, where A denotes the first metal element, B denotes the second metal element, C denotes the third metal element, and x is 1.9 or greater and 2.9 or less.

In an embodiment, a total content of the second metal element and the third metal element in the second light absorbing layer may be in a range of about 5 at % to about 50 at % based on the total number of atoms of the first metal element, the second metal element, the third metal element, and oxygen (O) in the second light absorbing layer.

In an embodiment, the display device may further include a second capping layer covering the second transparent pattern, and the second light absorbing layer may be disposed on the second capping layer.

The display device according to embodiments may include a light absorbing layer that controls a viewing angle of light emitted from a light emitting device. The light absorbing layer may include a metal oxide including the first metal element, which is selected from molybdenum (Mo), copper (Cu) and chromium (Cr), and the second metal element of Group 15. In such embodiments, the light absorbing layer may have a thickness in a range of about 500 Å to about 10000 Å. Accordingly, even when the light absorbing layer has a single-layer structure, the light absorbing layer may have characteristics such as low reflection and/or low transmission, and improved chemical resistance, at the same time. Accordingly, a separate layer conventionally provided for protecting the light absorbing layer above and/or below the light absorbing layer may be omitted, such that the structure of the light absorbing layer can be simplified, thereby simplifying the structure of the display device. Accordingly, the efficiency of the manufacturing process of the display device may be improved and the manufacturing cost may be reduced.

It is to be understood that both the foregoing general description and the following detailed description are exemplary and explanatory and are intended to provide further explanation of the invention as claimed.

BRIEF DESCRIPTION OF THE DRAWINGS

Illustrative, non-limiting embodiments will be more clearly understood from the following detailed description taken in conjunction with the accompanying drawings.

FIG. 1 is a plan view illustrating a display device according to an embodiment.

FIG. 3 is a cross-sectional view taken along line I-I' of FIG. 2.

FIG. 5 is a graph illustrating reflectance and transmission versus the thickness of the light absorption layer of FIG. 3.

FIGS. 6 to 11 are cross-sectional views illustrating an embodiment of a method of manufacturing the transparent pattern and the light absorbing layer of FIG. 3.

FIGS. 13 to 19 are cross-sectional views illustrating an embodiment of a manufacturing method of the first transparent pattern, the second transparent pattern, the first light absorbing layer, and the second light absorbing layer of FIG. 12.

DETAILED DESCRIPTION

Figure 2:
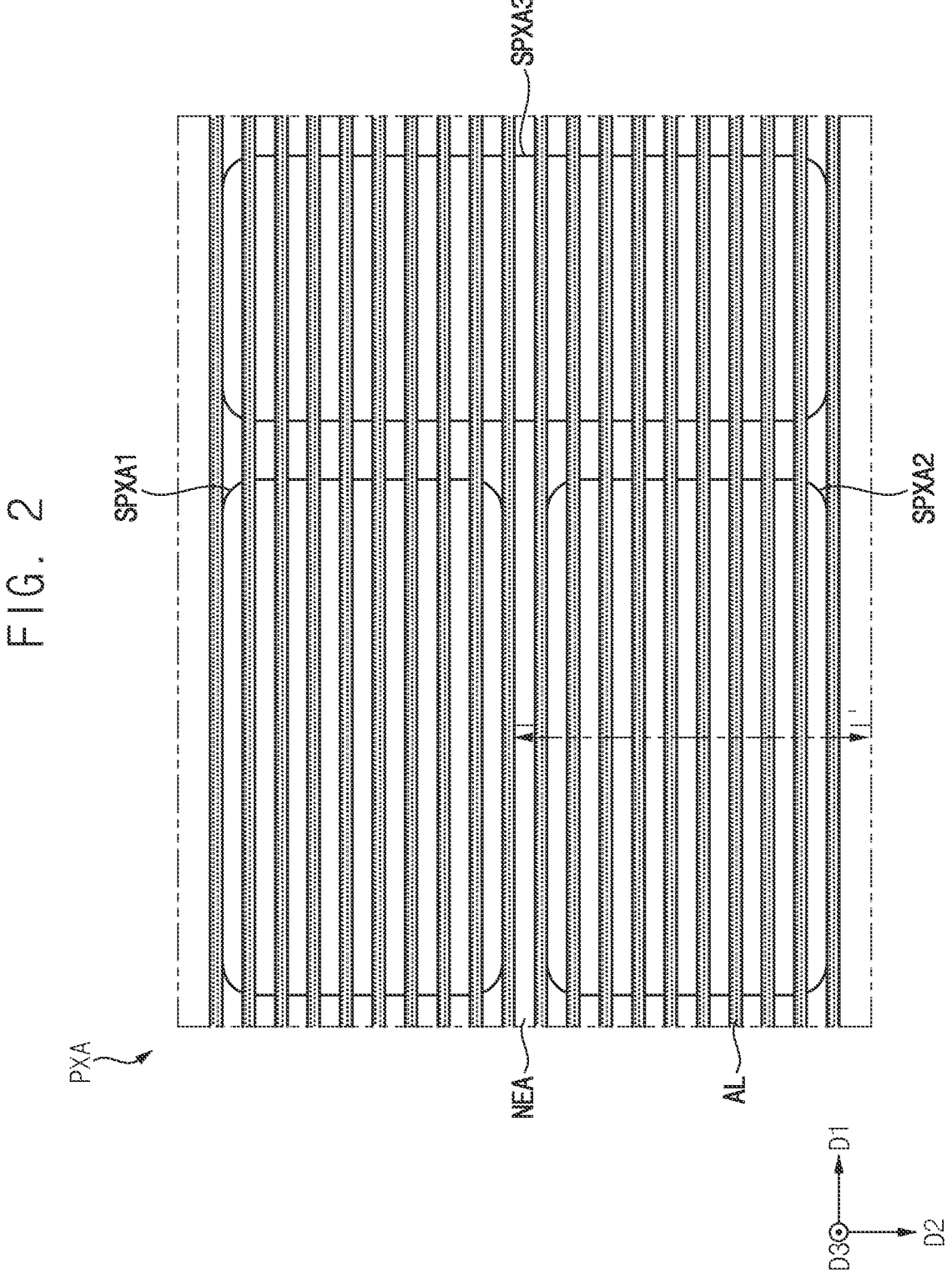
FIG. 2 is an enlarged view illustrating the pixel area of the display device of FIG. 1.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a plan view illustrating a display device according to an embodiment.

Referring to FIG. 1, the display device 10 according to an embodiment may be divided into a display area DA and a peripheral area PA. The display area DA may display an image, and the peripheral area PA may be located around the display area DA. In an embodiment, for example, the peripheral area PA may surround the display area DA when viewed in a plan view.

In an embodiment, the display device 10 may have a rectangular shape in a plan view. However, the invention is not necessarily limited thereto, and the display device 10 may have various shapes in a plan view. In an embodiment, a display surface of the display device 10 may be on a plane defined by a first direction D1 and a second direction D2 intersecting the first direction D1. A third direction D3 may be perpendicular to the plane. The third direction D3 may be a thickness direction of the display device 10. The third direction D3 may be referred to as a front direction of the display device 10.

The display device 10 may include a plurality of pixel areas PXA disposed in the display area DA. In an embodiment, for example, the pixel areas PXA may be arranged in a matrix form along the first direction D1 and the second direction D2.

FIG. 2 is an enlarged view illustrating the pixel area of the display device of FIG. 1.

Referring to FIGS. 1 and 2, the pixel area PXA may include a plurality of sub-pixel areas SPXA1, SPXA2, and SPXA3 that emit light of different colors, respectively, and a non-emission area NEA surrounding the plurality of sub-pixel areas SPXA1, SPXA2, and SPXA3. In an embodiment, for example, the first sub-pixel area SPXA1 may emit a red light, the second sub-pixel area SPXA2 may emit a green light, and the third sub-pixel area SPXA3 may emit a blue light. However, the invention is not necessarily limited thereto, and the first to third sub-pixel areas SPXA1, SPXA2, and SPXA3 may be combined so that each of the pixel areas PXA emits yellow, cyan, and magenta lights.

In an embodiment, an arrangement structure of the first to third sub-pixel areas SPXA1, SPXA2, and SPXA3 may be an S-stripe structure. In an embodiment, for example, the first sub-pixel area SPXA1 and the second sub-pixel area SPXA2 may be disposed in a first column, and the third sub-pixel area SPXA3 may be disposed in a second column adjacent to the first column. In such an embodiment, one side of each of the first sub-pixel area SPXA1 and the second sub-pixel area SPXA2 may be disposed to face a long side of the third sub-pixel area SPXA3. However, this is only an example, and the arrangement structure of the first to third sub-pixel areas SPXA1, SPXA2, and SPXA3 in a plan view is not necessarily limited thereto.

In an embodiment, the display device 10 may include a plurality of light absorbing layers AL. The light absorbing layers AL may be arranged side by side with each other in a plan view. In an embodiment, for example, the light absorbing layers AL may extend in the first direction D1 in a plan view. In such an embodiment, the light absorption layers AL may be spaced apart from each other in the second direction D2. In such an embodiment, the light absorbing layers AL may be parallel to each other. However, the arrangement of the light absorbing layers AL is not necessarily limited thereto.

The light absorbing layers AL may control a viewing angle of light emitted from each of the first to third sub-pixel areas SPXA1, SPXA2, and SPXA3. In an embodiment, the light absorbing layers AL may be disposed to overlap the first to third sub-pixel areas SPXA1, SPXA2, and SPXA3. However, the invention is not necessarily limited thereto. In an alternative embodiment, for example, the light absorbing layers AL may be disposed to be spaced apart from the first to third sub-pixel areas SPXA1, SPXA2, and SPXA3 and overlap the non-emission area NEA. In such an embodiment, the light absorbing layers AL may be disposed between the first to third sub-pixel areas SPXA1, SPXA2, and SPXA3. In an embodiment, the light absorbing layers AL may overlap some of the first to third sub-pixel areas SPXA1, SPXA2, and SPXA3 and may be spaced apart from the others.

Figure 3:
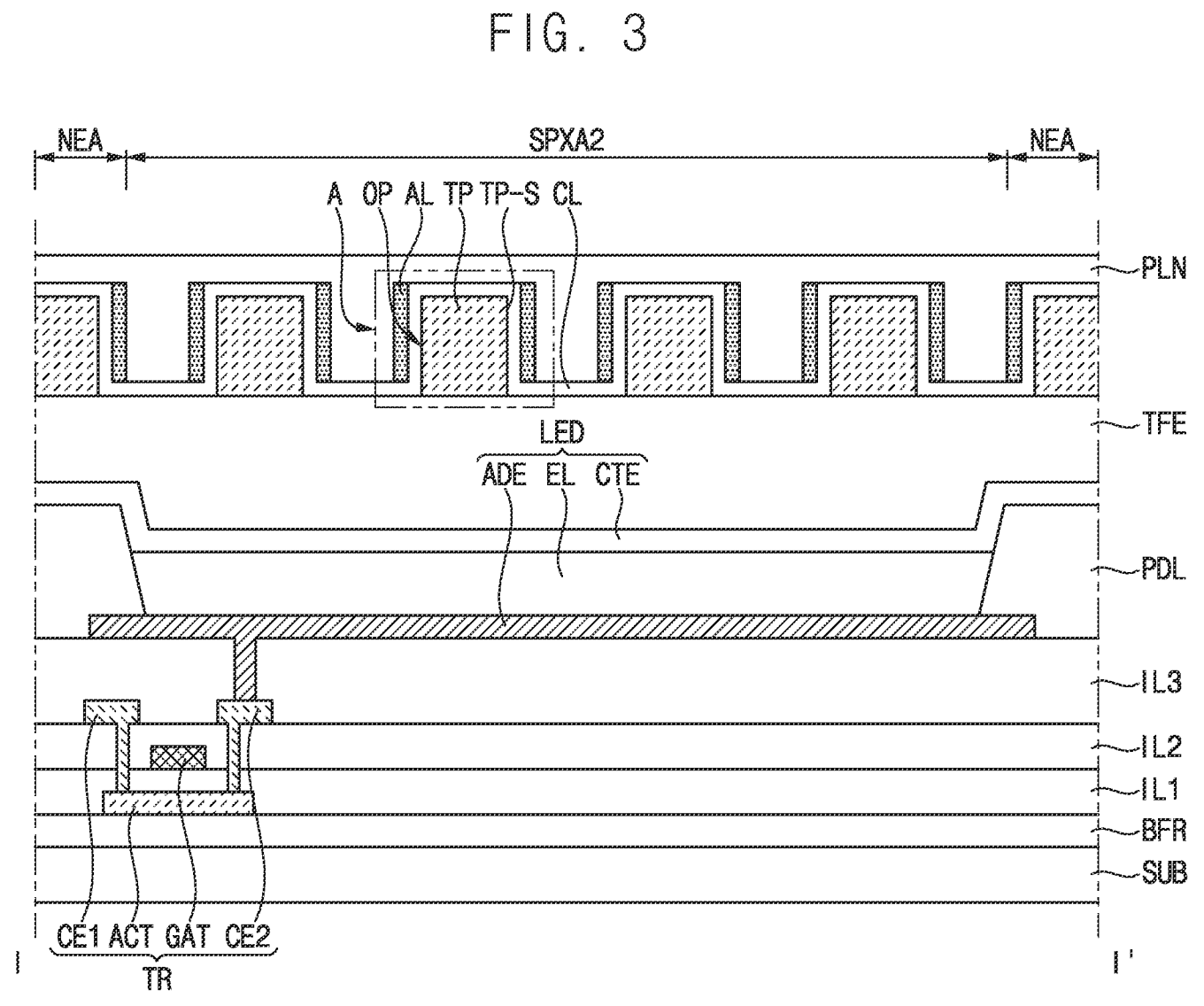

FIG. 3 is a cross-sectional view taken along line I-I' of FIG. 2. In FIG. 3, only a cross-sectional structure of the second sub-pixel area SPXA2 is illustrated for convenience of illustration and description. A cross-sectional structure of each of the first sub-pixel area SPXA1 and the third sub-pixel area SPXA3 may be substantially the same as the cross-sectional structure of the second sub-pixel area SPXA2.

Referring to FIG. 3, in an embodiment, the display device 10 may include a substrate SUB, a buffer layer BFR, a driving element TR, a plurality of insulating layers IL1, IL2 and IL3, a pixel defining layer PDL, and a light emitting device LED, an encapsulation layer TFE, a transparent pattern TP, a capping layer CL, and a light absorbing layer AL. The driving element TR may include an active pattern ACT, a gate electrode GAT, a first connection electrode CE1 and a second connection electrode CE2. The light emitting device LED may include a pixel electrode ADE, an emission layer EL, and a common electrode CTE.

The substrate SUB may include a transparent or opaque material. In an embodiment, for example, the substrate SUB may include glass, quartz, plastic, or the like. These may be used alone or in combination with each other.

The buffer layer BFR may be disposed on the substrate SUB. The buffer layer BFR may prevent diffusion of impurities such as oxygen, moisture, or the like to an upper portion of the substrate SUB through the substrate SUB. The buffer layer BFR may include an inorganic insulating material such as a silicon compound or a metal oxide. Examples of the inorganic insulating material that can be used as (or used to form) the buffer layer BFR may include silicon oxide, silicon nitride, or silicon oxynitride, that is, the buffer layer BFR may include at least one selected from silicon oxide, silicon nitride, and silicon oxynitride. These may be used alone or in combination with each other. The buffer layer BFR may have a single-layer structure or a multi-layer structure including a plurality of insulating layers.

Although not shown, in an embodiment, a barrier layer may be additionally disposed between the substrate SUB and the buffer layer BFR. The barrier layer may include an inorganic insulating material.

The active pattern ACT may be disposed on the buffer layer BFR. In an embodiment, the active pattern ACT may include a silicon semiconductor material or an oxide semiconductor material. Examples of the silicon semiconductor material that can be used as the active pattern ACT may include amorphous silicon or polycrystalline silicon. Examples of the oxide semiconductor material that can be used as the active pattern ACT may include indium gallium zinc oxide (IGZO) or indium tin zinc oxide (ITZO). In addition, the oxide semiconductor material may further include at least one selected from indium (In), gallium (Ga), tin (Sn), zirconium (Zr), vanadium (V), hafnium (Hf), cadmium (Cd), germanium (Ge), chromium (Cr)), titanium (Ti), and zinc (Zn). These may be used alone or in combination with each other.

In an embodiment, a first insulating layer IL1 may be disposed on the buffer layer BFR. The first insulating layer IL1 may cover the active pattern ACT. In an alternative embodiment, the first insulating layer IL1 may be disposed in a pattern shape on the active pattern ACT to expose a portion of the active pattern ACT. In an embodiment, for example, the first insulating layer IL1 may be disposed on the active pattern ACT in a pattern shape to overlap the gate electrode GAT. The first insulating layer IL1 may include an inorganic insulating material. Examples of inorganic insulating materials that can be used as the first insulating layer IL1 may include silicon oxide, silicon nitride, or silicon oxynitride. These may be used alone or in combination with each other.

The gate electrode GAT may be disposed on the first insulating layer IL1. In an embodiment, the gate electrode GAT may include a metal, an alloy, a conductive metal oxide, a transparent conductive material, or the like. Examples of materials that can be used as the gate electrode GAT may include silver (Ag), an alloy containing silver, molybdenum (Mo), an alloy containing molybdenum, aluminum (Al), an alloy containing aluminum, Aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

A second insulating layer IL2 may be disposed on the first insulating layer IL1. In an embodiment, the second insulating layer IL2 may cover the gate electrode GAT. The second insulating layer IL2 may include an inorganic insulating material. Examples of inorganic insulating materials that can be used as the second insulating layer IL2 may include silicon oxide, silicon nitride, or silicon oxynitride. These may be used alone or in combination with each other.

The first connection electrode CE1 and the second connection electrode CE2 may be disposed on the second insulating layer IL2. The first connection electrode CE1 and the second connection electrode CE2 may be electrically connected to the active pattern ACT through a contact hole defined or formed in the second insulating layer IL2. Each of the first connection electrode CE1 and the second connection electrode CE2 may include a metal, an alloy, a conductive metal oxide, a transparent conductive material, or the like. Examples of materials that can be used as the first connection electrode CE1 and the second connection electrode CE2 may include silver (Ag), an alloy containing silver, molybdenum (Mo), an alloy containing molybdenum, and aluminum. (Al), alloys containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. These may be used alone or in combination with each other.

The third insulating layer IL3 may be disposed on the second insulating layer IL2. The third insulating layer IL3 may cover the first connection electrode CE1 and the second connection electrode CE2. The third insulating layer IL3 may include an organic insulating material. Examples of organic insulating materials that can be used as the third insulating layer IL3 include photoresist, polyacryl-based resin, polyimide-based resin, and polyamide-based resin, siloxane-based resin, acrylic-based resin, epoxy-based resin, or the like. These may be used alone or in combination with each other. The third insulating layer IL3 may have a single-layer structure or a multi-layer structure including a plurality of insulating layers.

A configuration, an arrangement structure, and a connection structure of the driving element TR and each of the plurality of insulating layers IL1, IL2, and IL3 described with reference to FIG. 3 are only an example and may be variously changed.

The pixel electrode ADE may be disposed on the third insulating layer IL3. The pixel electrode ADE may be electrically connected to the driving element TR through a contact hole defined or formed in the third insulating layer IL3. In an embodiment, the pixel electrode ADE may include a metal, an alloy, a conductive metal oxide, a transparent conductive material, or the like.

The pixel defining layer PDL may be disposed on the third insulating layer IL3. The pixel defining layer PDL may define a pixel opening exposing a portion of the pixel electrode ADE, that is, the pixel opening may be defined through the pixel defining layer PDL to expose the portion of the pixel electrode ADE. In an embodiment, the pixel defining layer PDL may include an organic insulating material. Examples of organic insulating materials that can be used as the pixel defining layer PDL may include photoresist, polyacrylic resin, polyimide resin, or acrylic resin. These may be used alone or in combination with each other.

The emission layer EL may be disposed on the pixel electrode ADE in the pixel opening. The emission layer EL may include a material that emits light. In an embodiment, for example, the emission layer EL may include an organic light emitting material.

The common electrode CTE may be disposed on the emission layer EL. The common electrode CTE may include a conductive material such as a metal, an alloy, a conductive metal nitride, a conductive metal oxide, or a transparent conductive material. The common electrode CTE may have a single-layer structure or a multi-layer structure including a plurality of conductive layers. In an embodiment, the common electrode CTE may continuously extend over (or commonly provided to cover) a plurality of pixels.

The pixel electrode ADE, the emission layer EL disposed in the pixel opening, and the common electrode CTE may define the light emitting device LED. An area where the light emitting device LED is defined may be the second sub-pixel area SPXA2 described with reference to FIG. 2. In an embodiment, as shown in FIG. 3, the second sub-pixel area SPXA2 may be an area corresponding to the pixel opening.

The encapsulation layer TFE may be disposed on the light emitting device LED. The encapsulation layer TFE may protect the light emitting device LED from external moisture, heat, impact, or the like. Although not shown, the encapsulation layer TFE may include a first inorganic encapsulation layer, an organic encapsulation layer disposed on the first inorganic encapsulation layer, and a second inorganic encapsulation layer disposed on the organic encapsulation layer.

In an embodiment, the transparent pattern TP may be disposed on the encapsulation layer TFE. The transparent pattern TP may define an opening OP exposing a portion of an upper surface of the encapsulation layer TFE. The opening OP may be defined by a side surface TP-S of the transparent pattern TP. In such an embodiment, the opening OP may penetrate (or be defined through) the transparent pattern TP. In an embodiment, the transparent pattern TP may have a grid shape in a plan view.

The transparent pattern TP may include an organic insulating material and/or an inorganic insulating material having relatively high light transmission. In an embodiment, for example, the transparent pattern TP may include a siloxane-based material and/or a silica-based material.

In an alternative embodiment, an insulating layer may be additionally disposed between the encapsulation layer TFE and the transparent pattern TP. In such an embodiment, the transparent pattern TP may define an opening exposing an upper surface of the insulating layer.

The capping layer CL may cover the transparent pattern TP. in an embodiment, the capping layer CL may cover the side surface TP-S of the transparent pattern TP, the upper surface of the transparent pattern TP, and the exposed portion of the upper surface of the encapsulation layer TFE. In an embodiment, the capping layer CL may include an inorganic material. Examples of inorganic materials that can be used as the capping layer CL may include silicon oxide, silicon nitride, or silicon oxynitride. These may be used alone or in combination with each other.

The light absorbing layer AL may be disposed on the capping layer CL. The light absorbing layer AL may be disposed in the opening OP defined in the transparent pattern TP. In an embodiment, for example, the light absorbing layer AL may overlap the side surface TP-S of the transparent pattern TP. In such an embodiment, the light absorbing layer AL may overlap a side surface of the capping layer CL. Accordingly, the transparent pattern TP may be disposed between the plurality of light absorbing layers AL.

In an embodiment, the light absorbing layer AL may include a metal oxide including a first metal element and a second metal element different from the first metal element. In an embodiment, for example, the light absorbing layer AL may include a metal oxide represented by Chemical Formula 1 below.

$$ABO_x \qquad \text{[Chemical Formula 1]}$$

In Chemical Formula 1, A may be the first metal element and B may be the second metal element. In other words, the metal oxide included in the light absorbing layer AL may be a three-component metal oxide including the first metal element and the second metal element.

In an embodiment, examples of the first metal element may include molybdenum (Mo), copper (Cu), and chromium (Cr), that is, the first metal element may be selected from molybdenum (Mo), copper (Cu), and chromium (Cr).

Light emitted from the light emitting device LED may be incident on the light absorbing layer AL or may pass between the light absorbing layers AL. Some of the light incident on the light absorbing layer AL may pass through the light absorbing layer AL. Some of the light incident on the light absorbing layer AL may be reflected by the light absorbing layer AL. Some of the light incident on the light absorbing layer AL may be absorbed by the light absorbing layer AL.

In an embodiment, as the metal oxide included in the light absorbing layer AL includes the first metal element, reflectance and transmission of the light absorbing layer AL may be decreased. In such an embodiment, the amount of light transmitted through the light absorbing layer AL or reflected by the light absorbing layer AL among the light incident on the light absorbing layer AL may be reduced.

In an embodiment, for example, reflectance of the light absorbing layer AL for light emitted from the light emitting device LED may be about 30% or less. Specifically, the reflectance of the light absorbing layer AL may be in a range of about 1% to about 20%. Transmission of the light absorbing layer AL to light emitted from the light emitting element LED may be about 40% or less. Specifically, the transmission of the light absorption layer AL may be in a range of about 0.5% to about 25%, e.g., about 0.001% to about 10%. In such an embodiment, most of the light incident on the light absorbing layer AL may be absorbed by the light absorbing layer AL. Accordingly, the light absorbing layer AL may effectively control a viewing angle of light emitted from the light emitting device LED.

In an embodiment, the second metal element may be a Group 15 metal element. Examples of the second metal element may include tantalum (Ta), niobium (Nb), and vanadium (V), that is, the second metal element may be selected from tantalum (Ta), niobium (Nb), and vanadium (V).

In an embodiment, as the metal oxide included in the light absorbing layer AL includes the second metal element, chemical resistance of the light absorbing layer AL may be improved. Accordingly, during a manufacturing process of the display device 10, damage to the light absorbing layer AL by chemical materials may be reduced or prevented.

In an embodiment, a content of the second metal element in the light absorbing layer AL may be in a range of about 5 atomic percent (at %) to about 50 at % based on the total number of atoms of the first metal element, the second metal element, and oxygen (O). Specifically, the content of the second metal element in the light absorbing layer AL may be in a range of about 5 at % to about 20 at % based on a total number of atoms of the first metal element, the second metal element, and oxygen (O). In such an embodiment where the content of the second metal element satisfies the above range, low reflection and/or low transmission characteristics of the light absorbing layer AL may not deteriorate. Accordingly, chemical resistance of the light absorbing layer AL may be improved, and at the same time, characteristics such as low reflection and/or low transmission of the light absorbing layer AL may be further improved.

In an embodiment, in Chemical Formula 1, x may be a positive number of 1.9 to 2.9. In other words, in the metal oxide included in the light absorbing layer AL, a ratio of the first metal element to oxygen (O) may be 1:1.9 to 1:2.9. In an embodiment, for example, in the metal oxide included in the light absorption layer AL, the ratio of the first metal element to oxygen (O) may be 1:2.2 to 1:2.4. In such an embodiment, where the ratio of the first metal element to oxygen (O) satisfies the above range, the chemical resistance of the light absorbing layer AL may be further improved. In addition, characteristics such as low reflection and/or low transmission of the light absorbing layer AL may be further improved.

In an embodiment, the light absorbing layer AL may have a single-layer structure. As described above, as the light absorbing layer AL includes the metal oxide including the first metal element selected from molybdenum (Mo), copper (Cu), and chromium (Cr) and the second metal element of Group 15, the light absorbing layer AL may have characteristics such as low reflection and/or low transmission, and may have improved chemical resistance at the same time. Accordingly, in such an embodiment, a separate layer conventionally provided for protecting the light absorbing layer AL above and/or below the light absorbing layer AL may be omitted, such that the structure of the light absorbing layer AL may be simplified, thereby simplifying the structure of the display device 10.

In an embodiment, the metal oxide included in the light absorbing layer AL may further include a third metal element different from the first metal element and the second metal element. In an embodiment, for example, the light absorbing layer AL may include a metal oxide represented by Chemical Formula 2 below.

ABCO$x$             [Chemical Formula 2]

In Chemical Formula 2, A may be the first metal element, B may be the second metal element, and C may be the third metal element. In other words, the metal oxide included in the light absorbing layer AL may be a four-component metal oxide including the first metal element, the second metal element, and the third metal element.

In an embodiment, the third metal element may be a group 14 metal element. Examples of the third metal element may include titanium (Ti), zirconium (Zr), and hafnium (Hf), that is, the third metal element may be selected from titanium (Ti), zirconium (Zr), and hafnium (Hf).

In an embodiment, as the metal oxide included in the light absorbing layer AL further includes the third metal element, characteristics such as low reflection and/or low transmission of the light absorbing layer AL may be maintained, and at the same time, chemical resistance may be further improved.

In an embodiment, where the light absorption layer AL further includes the third metal element, a total content of the second metal element and the third metal element in the light absorption layer AL may be in a range of about 5 at % to about 50 at % based on a total number of atoms of the first metal element, the second metal element, the third metal element, and oxygen (O). In an embodiment, for example, the total content of the second metal element and the third metal element in the light absorption layer AL may be in a range of about 5 at % to about 20 at % based on the total number of atoms of the first metal element, the second metal element, the third metal element, and oxygen (O). In such an embodiment where the total content of the second metal element and the third metal element satisfies the above range, low reflection and/or low transmission characteristics of the light absorbing layer AL may not deteriorate. Accordingly, chemical resistance of the light absorbing layer AL may be improved, and at the same time, characteristics such as low reflection and/or low transmission of the light absorbing layer AL may be further improved.

In an embodiment, in Chemical Formula 2, x may be a positive number of 1.9 to 2.9. In other words, in the metal oxide included in the light absorbing layer AL, a ratio of the first metal element to oxygen (O) may be 1:1.9 to 1:2.9. In an embodiment, for example, in the metal oxide included in the light absorption layer AL, the ratio of the first metal element to oxygen (O) may be 1:2.2 to 1:2.4. In such an embodiment where the ratio of the first metal element to oxygen (O) satisfies the above range, the chemical resistance of the light absorbing layer AL may be further improved. In addition, characteristics such as low reflection and/or low transmission of the light absorbing layer AL may be further improved.

A planarization layer PLN may cover the transparent pattern TP, the light absorbing layer AL, and the capping layer CL. The planarization layer PLN may have a substantially flat upper surface. The planarization layer PLN may be disposed between the light absorbing layers AL. In an embodiment, the planarization layer PLN may be disposed while filling the empty space of the opening OP of the transparent pattern TP. In an embodiment, the planarization layer PLN may include a same material as the transparent pattern TP. In an embodiment, for example, the planarization layer PLN may include an organic insulating material having relatively high light transmission.

Figure 4:
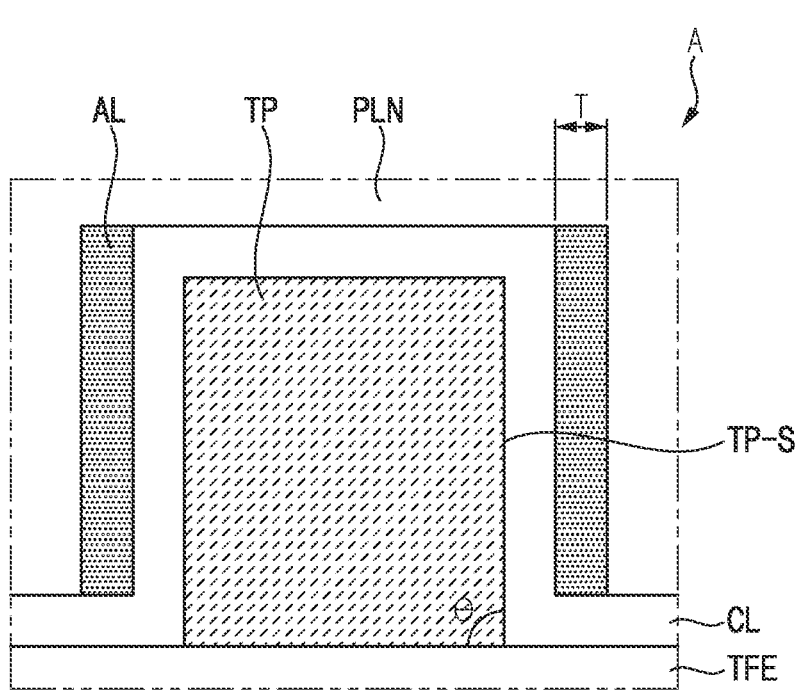
FIG. 4 is an enlarged view illustrating an area 'A' of FIG. 3.

FIG. 4 is an enlarged view illustrating an area 'A' of FIG. 3.

Referring to FIGS. 3 and 4, in an embodiment, a taper angle θ of the side surface TP-S of the transparent pattern TP may be in a range of about 80 degrees to about 90 degrees. In such an embodiment, an angle between the upper surface of the encapsulation layer TFE and the side surface TP-S of the transparent pattern TP may be about 80 degrees to about 90 degrees. In an embodiment, for example, as shown in FIG. 4, the taper angle θ of the side surface TP-S of the transparent pattern TP may be about 90 degrees.

In an embodiment, as described above, as the light absorbing layer AL includes the metal oxide including the first metal element, which is selected from molybdenum (Mo), copper (Cu), and chromium (Cr), and the second metal element of Group 15, the light absorbing layer AL may have a single-layer structure. In such an embodiment, an upper limit of a thickness of the light absorbing layer AL, which controls the viewing angle of light emitted from the light emitting device LED, may be increased. According to embodiments, even when the thickness of the light absorption layer AL is increased, characteristics such as low reflection and/or low transmission and chemical resistance of the light absorption layer AL may be maintained.

For example, according to embodiments, the thickness T of the light absorption layer AL may be in a range of about 500 angstrom (Å) to about 10000 Å, e.g., in a range of about 2000 Å to about 4000 Å. Here, the thickness T of the light absorbing layer AL may mean a distance from one side of the light absorbing layer AL that is in contact with the side surface of the capping layer CL to one side of the light absorbing layer AL that is farthest from the side surface of the capping layer CL.

FIG. 5 is a graph illustrating reflectance and transmission versus the thickness of the light absorption layer of FIG. 3. Particularly, (a) of FIG. 5 is a graph illustrating the reflectance versus the thickness T of the light absorbing layer AL, and (b) of FIG. 5 is a graph illustrating the transmission versus the thickness T of the light absorbing layer AL.

Referring to FIG. 5, when the thickness T of the light absorbing layer AL is in a range of about 500 Å to about 10000 Å, the reflectance of the light absorbing layer AL for light in the wavelength range of about 380 nm to about 780 nm is about 30% or less, and the transmission is about 40% or less. In an embodiment of the invention, where the thickness T of the light absorbing layer AL satisfies the above range, most of the light incident on the light absorbing layer AL may be absorbed by the light absorbing layer AL. Accordingly, the light absorbing layer AL may effectively control a viewing angle of light emitted from the light emitting device LED.

If the thickness T of the light absorbing layer AL is less than 500 Å, the transmission of the light absorbing layer AL to light in a wavelength range of about 380 nm to about 780 nm exceeds about 40%. Accordingly, it may be difficult to control a viewing angle of the light emitted from the light emitting device LED.

In addition, as shown in (a) and (b) of FIG. 5, even when the thickness T of the light absorbing layer AL is substantially great, the light absorbing layer AL has low reflection and/or low transmission. For example, even when the thickness T of the light absorbing layer AL is about 1000 Å or greater, the reflectance of the light absorbing layer AL for light in the wavelength range of about 380 nm to about 780 nm is about 25% or less, and the transmission is about 20% or less. Accordingly, in an embodiment of the invention, even when the thickness of the light absorption layer AL is increased, characteristics such as low reflection and/or low transmission and chemical resistance of the light absorption layer AL may be maintained.

FIGS. 6 to 11 are cross-sectional views illustrating an embodiment of a method of manufacturing the transparent pattern TP and the light absorbing layer AL of FIG. 3.

Figure 6:
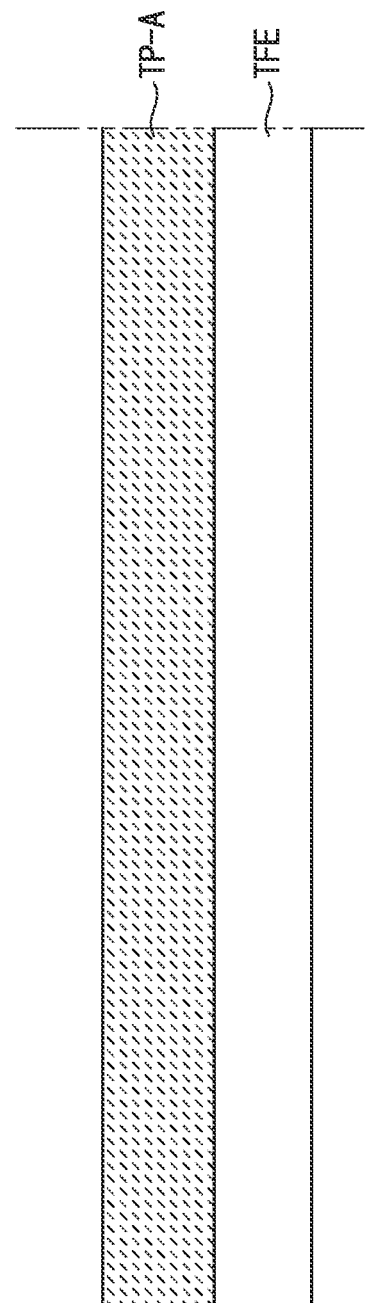

Referring to FIG. 6, in an embodiment of a method of manufacturing the transparent pattern TP and the light absorbing layer AL, a preliminary transparent pattern layer TP-A may be formed on the encapsulation layer TFE. The preliminary transparent pattern layer TP-A may include an organic insulating material and/or an inorganic insulating material having relatively high light transmittance.

Figure 7:
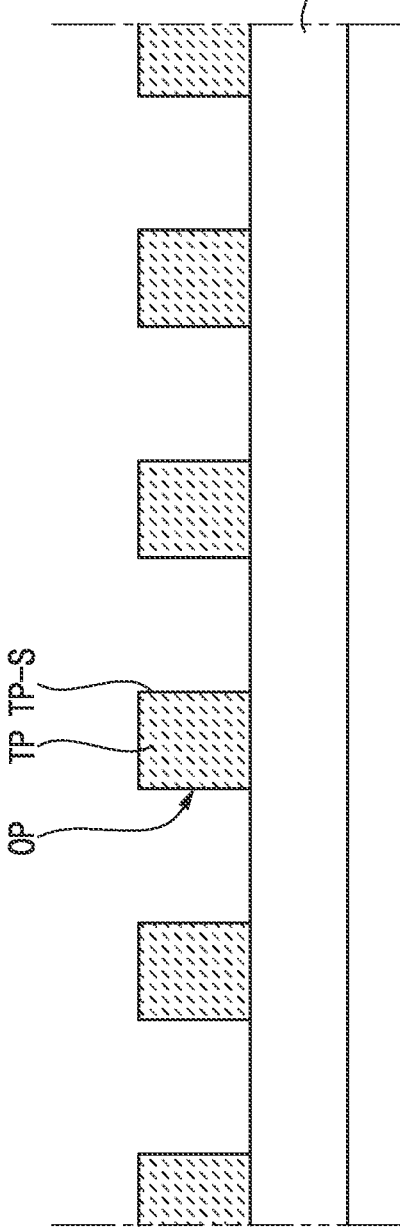

Referring further to FIG. 7, the transparent pattern TP may be formed by patterning the preliminary transparent pattern layer TP-A through exposure and development processes. The transparent pattern TP may define the opening OP exposing the encapsulation layer TFE (or (a portion of an upper surface thereof). The opening OP may be defined by the side surface TP-S of the transparent pattern TP.

Figure 8:
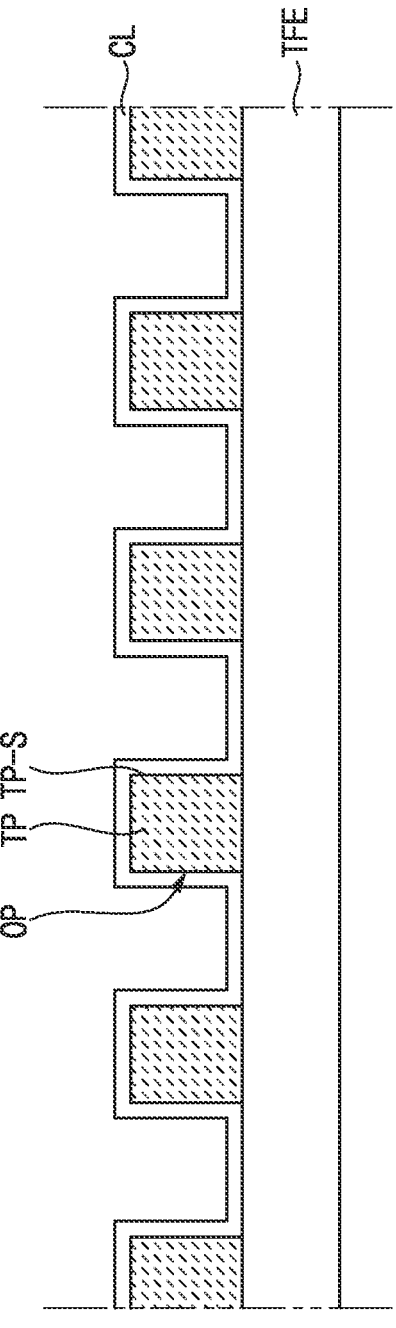

Referring to FIG. 8, the capping layer CL may be formed on the transparent pattern TP and the encapsulation layer TFE. The capping layer CL may cover the transparent pattern TP and the encapsulation layer TFE. The capping layer CL may include or be formed of at least one selected from silicon oxide, silicon nitride, and silicon oxynitride.

Figure 9:
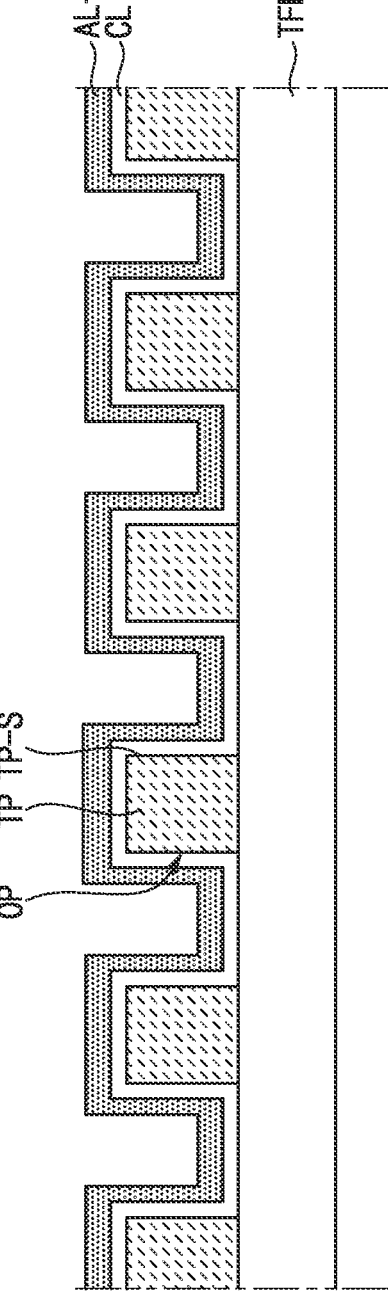

Referring to FIG. 9, a preliminary light absorption layer AL-A may be formed on the capping layer CL. The preliminary light absorbing layer AL-A may cover the capping layer CL. The preliminary light absorbing layer AL-A may include the metal oxide including the first metal element, which is selected from molybdenum (Mo), copper (Cu), and chromium (Cr), and the second metal element of Group 15.

In an embodiment, a thickness of a portion of the preliminary light absorption layer AL-A overlapping the upper surface of the capping layer CL may be greater than a thickness of a portion of the preliminary light absorption layer AL-A overlapping the side surface of the capping layer CL. In an embodiment, the sum of the thicknesses of the portion of the preliminary light absorption layer AL-A overlapping the upper surface of the capping layer CL and the thickness of the portion of the preliminary light absorption layer AL-A overlapping the side surface of the capping layer CL may be in a range of about 3000 Å to about 10000 Å.

Figure 10:
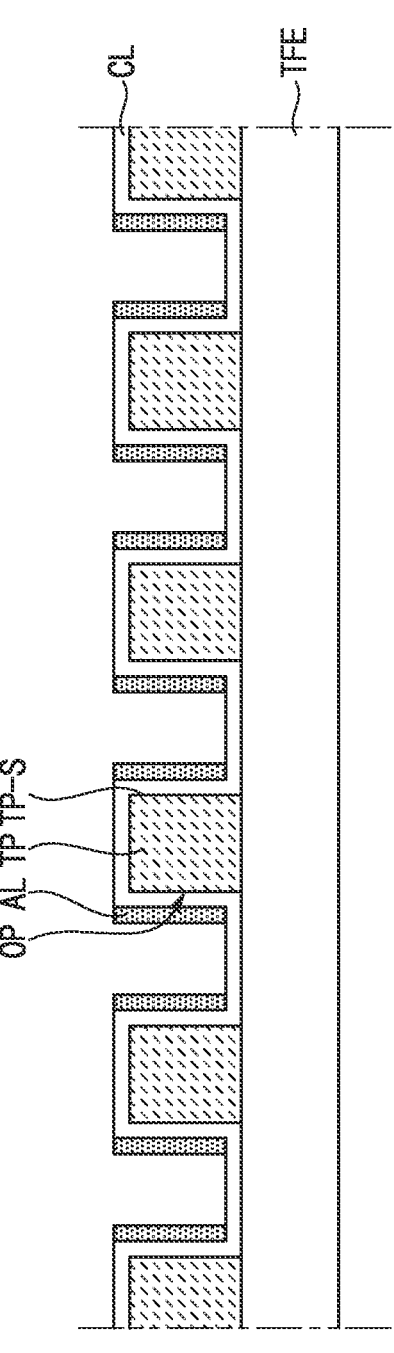

Further referring to FIG. 10, a portion of the preliminary light absorption layer AL-A may be anisotropically dry etched. As the portion of the preliminary light absorbing layer AL-A is anisotropically dry etched, the light absorbing layer AL may be formed. Accordingly, the light absorbing layer AL may include the metal oxide including the first metal element, which is selected from molybdenum (Mo), copper (Cu), and chromium (Cr), and the second metal element of Group 15. The light absorbing layer AL may overlap the side surface TP-S of the transparent pattern TP. In such an embodiment, the light absorbing layer AL may overlap the side surface of the capping layer CL.

According to embodiments, the preliminary light absorption layer AL-A and the light absorption layer AL may include the metal oxide including the first metal element, which is selected from molybdenum (Mo), copper (Cu), and chromium (Cr), and the second metal element of group 15. Accordingly, the light absorption layer AL may have a single-layer structure. In such embodiments, a process of forming the preliminary light absorption layer AL-A may be performed in a single process, and a process of forming the light absorption layer AL by etching the preliminary light absorption layer AL-A may also be performed in a single process. Accordingly, the process of forming the light absorbing layer AL may be simplified, such that an efficiency of the manufacturing process of the display device 10 may be improved.

Referring to FIG. 11, the planarization layer PLN may be formed between the light absorbing layers AL. The planarization layer PLN may cover the capping layer CL and the light absorbing layer AL. In such an embodiment, the planarization layer PLN may be formed to fill the empty space of the opening OP of the transparent pattern TP. In an embodiment, a height of the planarization layer PLN may be greater than a height of the transparent pattern TP. However, the invention is not necessarily limited thereto.

Figure 12:
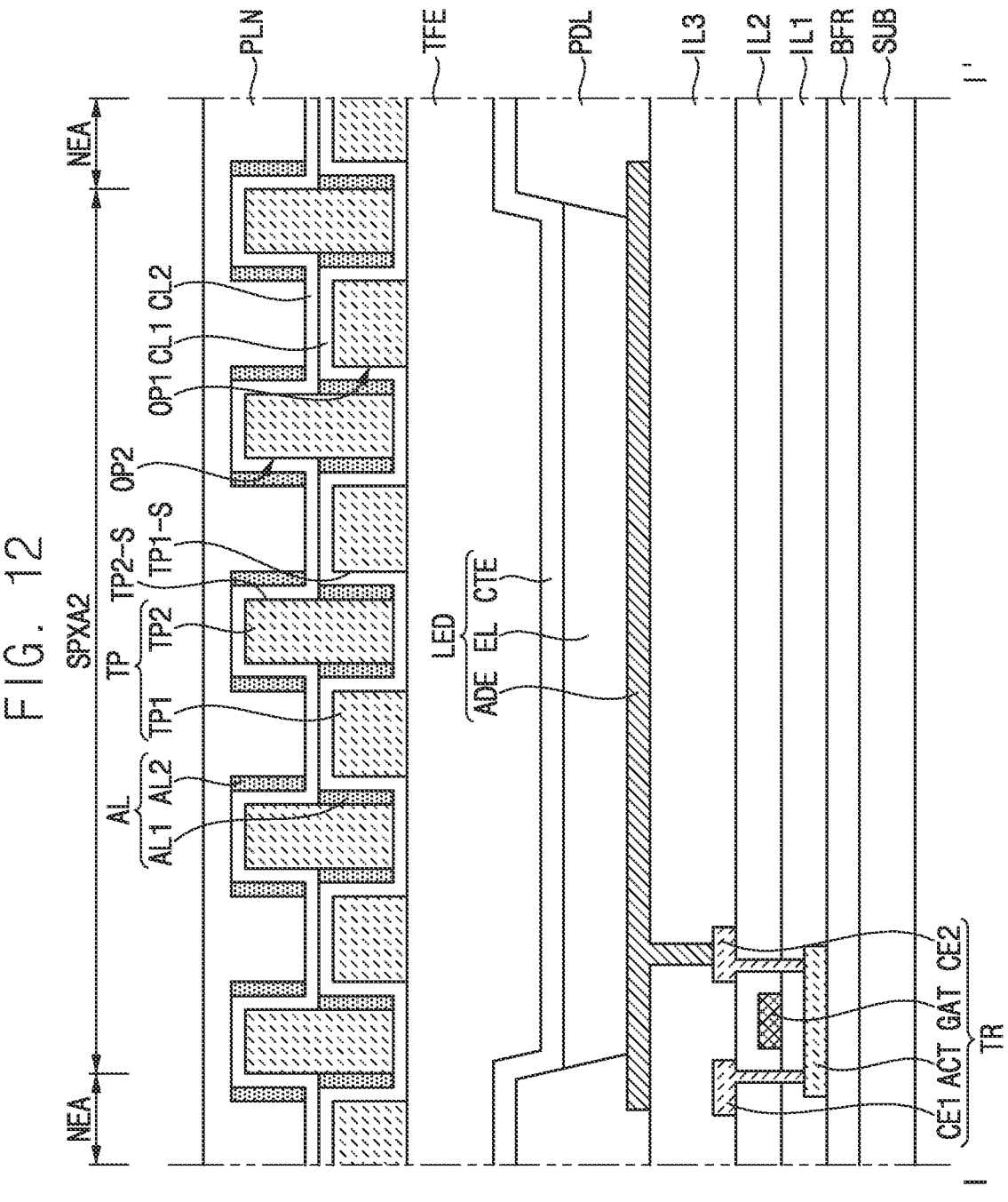
FIG. 12 is a cross-sectional view illustrating a display device according to an alternative embodiment.

FIG. 12 is a cross-sectional view illustrating a display device according to an alternative embodiment. Particularly, FIG. 12 may correspond to the cross-sectional view of FIG. 3.

The embodiment of the display device 20 shown in FIG. 12 may be substantially same as the embodiment of the display device 10 described with reference to FIG. 3, except for the structure of the transparent pattern TP and the light absorbing layer AL. Hereinafter, the display device 20 shown in FIG. 12 will be described, focusing on differences from the display device 10 described with reference to FIG. 3.

According to an embodiment of the display device 20, as shown in FIG. 12, the transparent pattern TP may include a first transparent pattern TP1 and a second transparent pattern TP2, and the light absorbing layer AL may include the first light absorbing layer AL1 and a second light absorption layer AL2, and the capping layer CL may include a first capping layer CL1 and a second capping layer CL2.

The first transparent pattern TP1 may define a first opening OP1 exposing the upper surface of the encapsulation layer TFE. The first opening OP1 may be defined from the side surface TP1-S of the first transparent pattern TP1. In such an embodiment, the first opening OP1 may penetrate (or be defined through) the first transparent pattern TP1. The first transparent pattern TP1 may include an organic insulating material and/or an inorganic insulating material having high light transmittance. In an embodiment, for example, the first transparent pattern TP1 may include a siloxane-based material and/or a silica-based material.

The first capping layer CL1 may cover the first transparent pattern TP1. In an embodiment, the first capping layer CL1 may cover the side surfaces TP1-S of the first transparent pattern TP1, an upper surface of the first transparent pattern TP1, and the encapsulation layer TFE. In an embodiment, the first capping layer CL1 may include an inorganic material. Examples of inorganic materials that can be used as the first capping layer CL1 may include silicon oxide, silicon nitride, or silicon oxynitride. These may be used alone or in combination with each other.

The first light absorbing layer AL1 may be disposed on the first capping layer CL1. The first light absorbing layer AL1 may be disposed in the first opening OP1 defined in the first transparent pattern TP1. In an embodiment, for example, the first light absorbing layer AL1 may overlap the side surface TP1-S of the first transparent pattern TP1. In such an embodiment, the first light absorbing layer AL1 may overlap the side surface of the first capping layer CL1. Accordingly, the first transparent pattern TP1 may be disposed between the plurality of first light absorbing layers AL1.

The second transparent pattern TP2 may be disposed in the first opening OP1 of the first transparent pattern TP1. In an embodiment, the second transparent pattern TP2 may be disposed while filling the empty space of the first opening OP1 of the first transparent pattern TP1. In an embodiment, the second transparent pattern TP2 may have a height higher than a height of the first transparent pattern TP1. Accordingly, some of the side surfaces TP2-S of the second transparent pattern TP2 may overlap the side surface TP1-S of the first transparent pattern TP1, some of the side surface TP-S of the second transparent pattern TP2 may overlap with the side surface TP-S of the second transparent pattern TP2, and some of the second transparent pattern TP2 may be spaced apart from the side surface TP1-S of the first transparent pattern TP1.

The second transparent pattern TP2 may define a second opening OP2 exposing a portion of the upper surface of the first capping layer CL1 and a portion of the upper surface of the first light absorbing layer AL1. The second opening OP2 may be defined from a portion of the side surface TP2-S of the second transparent pattern TP2. In an embodiment, the second transparent pattern TP2 may include substantially the same material as the first transparent pattern TP1. In an embodiment, for example, the second transparent pattern TP2 may include an organic insulating material and/or an inorganic insulating material having high light transmittance.

The second capping layer CL2 may cover the second transparent pattern TP2. in an embodiment, the second capping layer CL2 may cover the side surface TP2-S of the second transparent pattern TP2, the upper surface of the second transparent pattern TP2, the first light absorbing layer AL1, and the first capping layer CL1. In an embodiment, the second capping layer CL2 may include an inorganic material. Examples of inorganic materials that can be used as the second capping layer CL2 may include silicon oxide, silicon nitride, or silicon oxynitride. These may be used alone or in combination with each other.

The second light absorbing layer AL2 may be disposed on the second capping layer CL2. The second light absorbing layer AL2 may be disposed in the second opening OP2 defined in the second transparent pattern TP2. In an embodiment, for example, the second light absorbing layer AL2 may overlap the side surface TP2-S of the second transparent pattern TP2. In such an embodiment, the second light absorbing layer AL2 may overlap the side surface of the second capping layer CL2. Accordingly, the first transparent pattern TP2 may be disposed between the plurality of second light absorbing layers AL2.

The planarization layer PLN may cover the second transparent pattern TP2, the second light absorbing layer AL2, and the second capping layer CL2. The planarization layer PLN may have a substantially flat upper surface. The planarization layer PLN may be disposed between the second light absorbing layers AL2. In such an embodiment, the planarization layer PLN may be disposed while filling the empty space of the second opening OP2 of the second transparent pattern TP2.

In an embodiment, at least one selected from the first light absorbing layer AL1 and the second light absorbing layer AL2 may include the metal oxide. In addition, the metal oxide included in the at least one selected from the first light absorbing layer AL1 and the second light absorbing layer AL2 may be substantially the same as the metal oxide included in the light absorbing layer AL described with reference to FIG. 3.

In an embodiment, for example, the at least one selected from the first light absorbing layer AL1 and the second light absorbing layer AL2 may include a metal oxide represented by Chemical Formula 1 below.

$$ABOx \hspace{2cm} \text{[Chemical Formula 1]}$$

In Chemical Formula 1, A may be the first metal element and B may be the second metal element. In other words, the metal oxide included in the light absorbing layer AL may be a three-component metal oxide including the first metal element and the second metal element.

In an embodiment, the content of the second metal element in the at least one selected from the first light absorbing layer AL1 and the second light absorbing layer AL2 may be in a range of about 5 at % to about 50 at % based on the total number of atoms of the first metal element, the second metal element, and oxygen (O). In an embodiment, for example, the content of the second metal element in the at least one selected from the first light absorbing layer AL1 and the second light absorbing layer AL2 may be in a range of about 5 at % to about 20 at % based on the total number of atoms of the first metal element, the second metal element, and oxygen (O).

In an embodiment, in Chemical Formula 1, x may be a positive number of 1.9 to 2.9. In other words, in the metal oxide included in the at least one selected from the first light absorbing layer AL1 and the second light absorbing layer AL2, the ratio of the first metal element to oxygen (O) may be 1:1.9 to 1:2.9. In an embodiment, for example, in the metal oxide included in the at least one selected from the first light absorbing layer AL1 and the second light absorbing layer AL2, the ratio of the first metal element to oxygen (O) may be 1:2.2 to 1:2.4.

In an embodiment, as at least one selected from the first light absorbing layer AL1 and the second light absorbing layer AL2 includes the metal oxide including the first metal element, which is selected from molybdenum (Mo), copper (Cu), and chromium (Cr), and the second metal element of Group 15, the at least one selected from the first light absorbing layer AL1 and the second light absorbing layer AL2 may have a single layer structure. In such an embodiment, a thickness of the at least one selected from the first light absorbing layer AL1 and the second light absorbing layer AL2 may be in a range of about 500 Å to about 10000 Å. In an embodiment, for example, the thickness of the at least one selected from the first light absorbing layer AL1 and the second light absorbing layer AL2 may be in a range of about 2000 Å to about 4000 Å.

In an embodiment, the metal oxide included in the at least one selected from the first light absorbing layer AL1 and the second light absorbing layer AL2 may further include the third metal element different from the first metal element and the second metal element.

In an embodiment, for example, the at least one selected from the first light absorbing layer AL1 and the second light absorbing layer AL2 may include a metal oxide represented by Chemical Formula 2 below.

$$ABCOx \hspace{2cm} \text{[Chemical Formula 2]}$$

In Chemical Formula 2, A may be the first metal element, B may be the second metal element, and C may be the third metal element. In other words, the metal oxide included in the light absorbing layer AL may be a four-component metal oxide including the first metal element, the second metal element, and the third metal element.

In an embodiment, the total content of the second metal element and the third metal element in the at least one selected from the first light absorbing layer AL1 and the second light absorbing layer AL2 may be in a range of about 5 at % to about 50 at % based on the total number of atoms of the first metal element, the second metal element, the third metal element, and oxygen (O). In an embodiment, for example, the total content of the second metal element and the third metal element in the at least one selected from the first light absorbing layer AL1 and the second light absorbing layer AL2 may be in a range of about 5 at % to about 20 at % based on the total number of atoms of the first metal element, the second metal element, the third metal element, and oxygen (O).

In an embodiment, in Chemical Formula 2, x may be a positive number of 1.9 to 2.9. In other words, in the metal oxide included in the at least one selected from the first light absorbing layer AL1 and the second light absorbing layer AL2, the ratio of the first metal element to oxygen (O) may be 1:1.9 to 1:2.9. In an embodiment, for example, in the metal oxide included in the at least one selected from the first light absorbing layer AL1 and the second light absorbing layer AL2, the ratio of the first metal element to oxygen (O) may be 1:2.2 to 1:2.4.

FIGS. 13 to 19 are cross-sectional views illustrating an embodiment of a manufacturing method of the first transparent pattern TP1, the second transparent pattern TP2, the first light absorbing layer AL1, and the second light absorbing layer AL2 of FIG. 12.

Referring to FIG. 13, in an embodiment of a manufacturing method of the first transparent pattern TP1, the second transparent pattern TP2, the first light absorbing layer AL1, and the second light absorbing layer AL2, the first transparent pattern TP1, the first capping layer CL1 and the first light absorbing layer AL1 may be formed on the encapsulation layer TFE. A process of forming the first transparent pattern TP1, the first capping layer CL1, and the first light absorbing layer AL1 on the encapsulation layer TFE may be substantially the same as the process of forming the transparent pattern TP, the capping layer CL, and the light absorbing layer AL described with reference to FIGS. 6 to 10.

In an embodiment, for example, the first transparent pattern TP1 defining the first opening OP1 may be formed by patterning the first preliminary transparent pattern layer, and the first capping layer CL1 covering the first transparent pattern TP1 may be formed, and the first light absorbing layer AL1 may be formed by anisotropic dry etching of the preliminary first light absorbing layer covering the first capping layer CL1.

Figure 14:
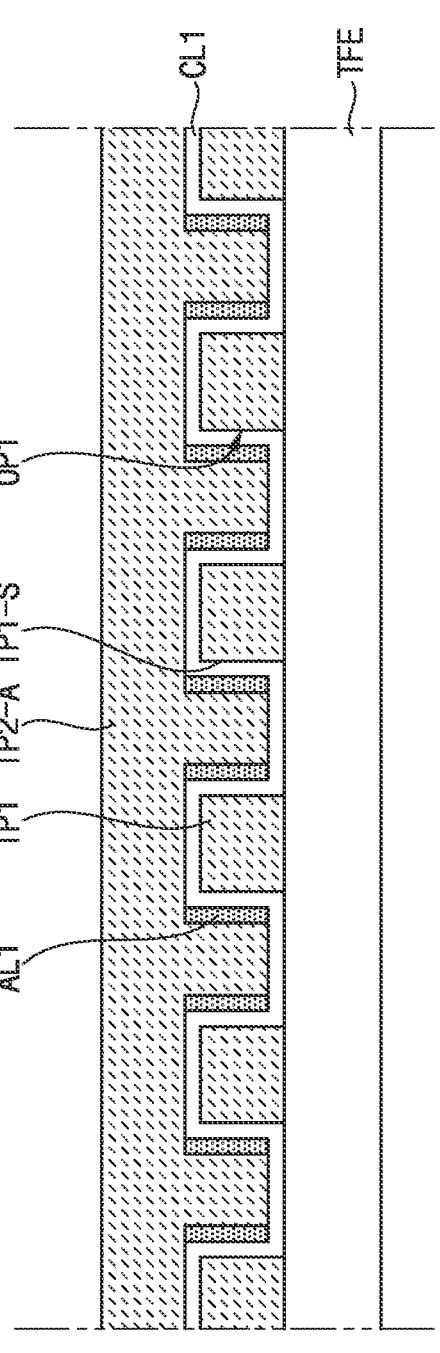

Referring to FIG. 14, a second preliminary transparent pattern layer TP2-A may be formed on the first capping layer CL1 and the first light absorbing layer AL1. The second preliminary transparent pattern layer TP2-A may cover the first capping layer CL1 and the first light absorbing layer AL1. In an embodiment, for example, the second preliminary transparent pattern layer TP2-A may be formed to fill the empty space of the first opening OP1. The second preliminary transparent pattern layer TP2-A may include an organic insulating material and/or an inorganic insulating material having relatively high light transmittance.

Figure 15:
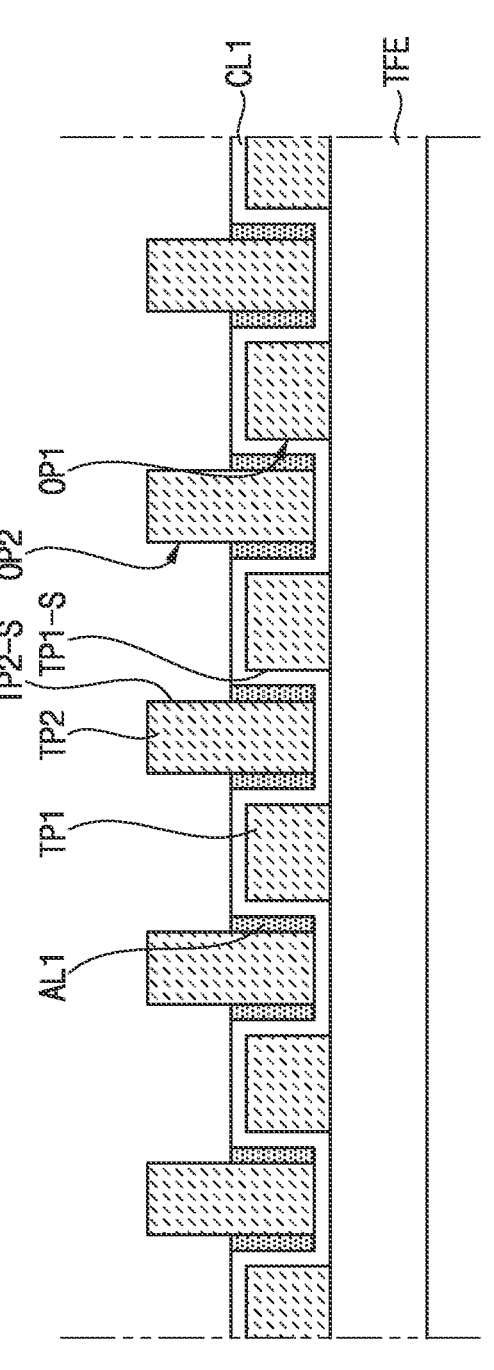

Referring further to FIG. 15, the second transparent pattern TP2 may be formed by patterning the second preliminary transparent pattern layer TP2-A through exposure and development processes. The second transparent pattern TP2 may define a second opening OP2 exposing a portion of an upper surface of the first capping layer CL1 and a portion of an upper surface of the first light absorbing layer AL1. The second opening OP2 may be defined by the side surface TP2-S of the second transparent pattern TP2.

Referring to FIG. 16, the second capping layer CL2 may be formed on the second transparent pattern TP2. The second capping layer CL2 may cover the second transparent pattern TP2, the first light absorbing layer AL1, and the first capping layer CL1. The second capping layer CL2 may include or be formed of at least one selected from silicon oxide, silicon nitride, and silicon oxynitride.

Figure 17:
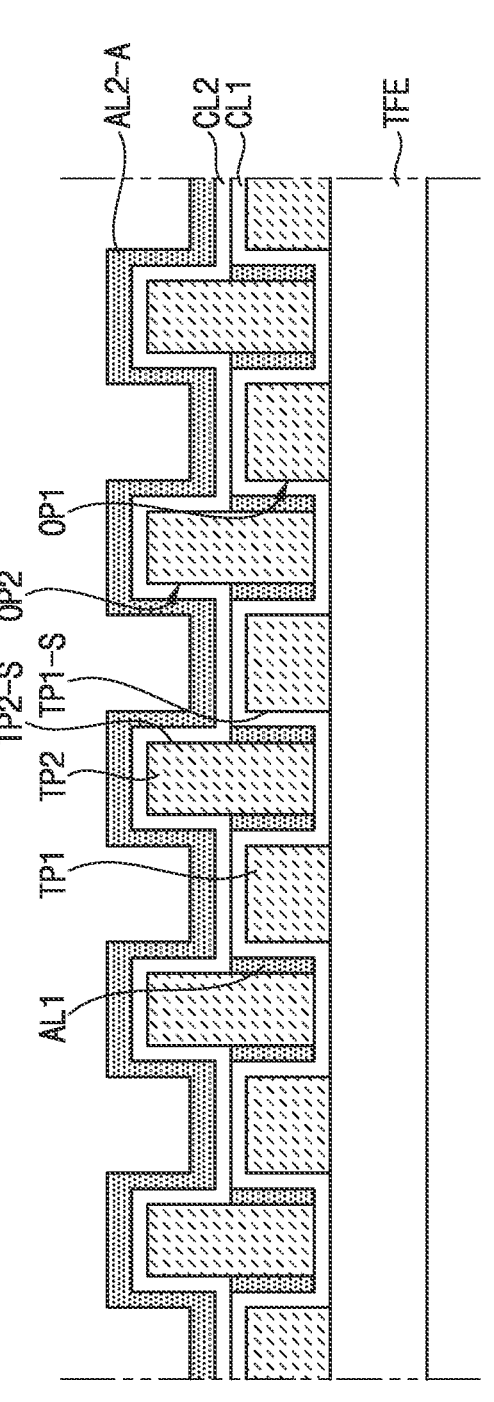

Referring to FIG. 17, a second preliminary light absorbing layer AL2-A may be formed on the second capping layer CL2. The second preliminary light absorbing layer AL2-A may cover the second capping layer CL2. The second preliminary light absorbing layer AL2-A may include the metal oxide including the first metal element, which is selected from molybdenum (Mo), copper (Cu), and chromium (Cr), and the second metal element of Group 15.

In an embodiment, a thickness of a portion of the second preliminary light absorbing layer AL2-A overlapping the upper surface of the second capping layer CL2 may be greater than a thickness of a portion of the second preliminary light absorbing layer AL2-A overlapping the side surface of the second capping layer CL2. In an embodiment, the sum of the thicknesses of the portion of the second preliminary light absorbing layer AL2-A overlapping the upper surface of the second capping layer CL2 and the thickness of the portion of the second preliminary light absorbing layer AL2-A overlapping the side surface of the second capping layer CL2 may be in a range of about 3000 Å to about 10000 Å.

Figure 18:
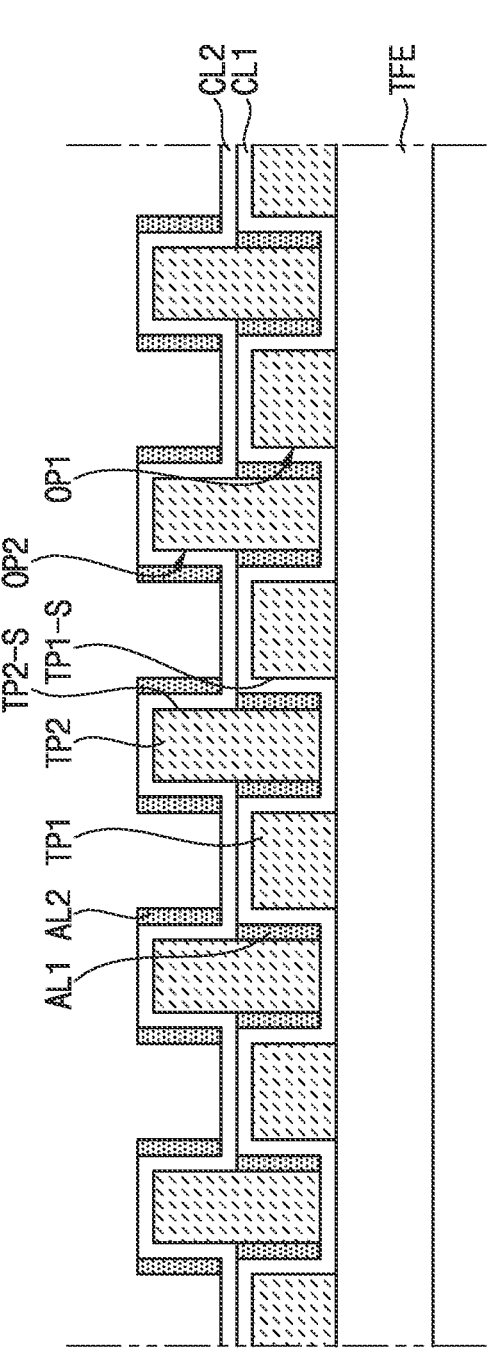

Further referring to FIG. 18, a portion of the second preliminary light absorbing layer AL2-A may be anisotropically dry etched. As the portion of the second preliminary light absorbing layer AL2-A is anisotropically dry etched, the second light absorbing layer AL2 may be formed. Accordingly, the second light absorbing layer AL2 may include the metal oxide including the first metal element, which is selected from molybdenum (Mo), copper (Cu), and chromium (Cr), and the second metal element of Group 15. The second light absorbing layer AL2 may overlap the side surface TP2-S of the second transparent pattern TP2. In such an embodiment, the second light absorbing layer AL2 may overlap the side surface of the second capping layer CL2.

Referring to FIG. 19, the planarization layer PLN may be formed between the second light absorbing layers AL2. The planarization layer PLN may cover the second capping layer CL2 and the second light absorbing layer AL2. In such an embodiment, the planarization layer PLN may be formed to fill the empty space of the second opening OP2 of the second transparent pattern TP2. In an embodiment, a height of the planarization layer PLN may be greater than a height of the second transparent pattern TP2. However, the invention is not necessarily limited thereto.

According to embodiments, the display device may include a light absorbing layer that controls a viewing angle of light emitted from a light emitting device. The light absorbing layer may include a metal oxide including the first metal element, which is selected from molybdenum (Mo), copper (Cu), and chromium (Cr), and the second metal element of Group 15. In such embodiments, the light absorbing layer may have a thickness of about 500 Å to about 10000 Å. In such an embodiment, even when the light absorbing layer has a single-layer structure, the light absorbing layer may have characteristics such as low reflection and/or low transmission, and improved chemical resistance, at the same time. Accordingly, in such embodiments, a separate layer conventionally provided for protecting the light absorbing layer above and/or below the light absorbing layer may be omitted, such that the structure of the light absorbing layer can be simplified, thereby simplifying the structure of the display device. In addition, in such embodiment, the efficiency of the manufacturing process of the display device may be improved and the manufacturing cost may be reduced.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate;
   a first transparent pattern disposed on the substrate, wherein a first opening is defined through the first transparent pattern; and
   a first light absorbing layer overlapping a side surface of the first transparent pattern defining the first opening, wherein
   the first light absorbing layer includes a metal oxide including a first metal element, which is selected from molybdenum (Mo), copper (Cu) and chromium (Cr), and a second metal element of Group 15, and
   the first light absorbing layer has a thickness in a range of about 500 Å to about 10000 Å.

2. The display device of claim 1, wherein the second metal element is selected from tantalum (Ta), niobium (Nb), and vanadium (V).

3. The display device of claim 1, wherein the metal oxide included in the first light absorbing layer is represented by the following chemical formula: ABOx,
   wherein A denotes the first metal element, B denotes the second metal element, and x is 1.9 or greater and 2.9 or less.

4. The display device of claim 3, wherein a content of the second metal element in the first light absorbing layer is in a range of about 5 at % to about 50 at % based on a total number of atoms of the first metal element, the second metal element and oxygen (O) in the first light absorbing layer.

5. The display device of claim 1, wherein the first light absorbing layer has a single-layer structure.

6. The display device of claim 1, wherein a taper angle of the side surface of the first transparent pattern is in a range of about 80 degrees to about 90 degrees.

7. The display device of claim 1, further comprising:
   a first capping layer covering the first transparent pattern, and
   wherein the first light absorbing layer is disposed on the first capping layer.

8. The display device of claim 1, wherein the metal oxide included in the first light absorbing layer further includes a third metal element of Group 14.

9. The display device of claim 8, wherein the third metal element is selected from titanium (Ti), zirconium (Zr), and hafnium (Hf).

10. The display device of claim 8, wherein the metal oxide included in the first light absorbing layer is represented by the following chemical formula: ABCOx,
    wherein A denotes the first metal element, B denotes the second metal element, C denotes the third metal element, and x is 1.9 or greater and 2.9 or less.

11. The display device of claim 10, wherein a total content of the second metal element and the third metal element in the first light absorbing layer is in a range of about 5 at % to about 50 at % based on a total number of atoms of the first metal element, the second metal element, the third metal element, and oxygen (O) in the first light absorbing layer.

12. The display device of claim 1, further comprising:
    a second transparent pattern disposed in the first opening of the first transparent pattern, wherein the second transparent pattern has a height greater than a height of the first transparent pattern, and a second opening is defined through the second transparent pattern; and
    a second light absorbing layer overlapping a side surface of the second transparent pattern defining the second opening.

13. The display device of claim 12, wherein
    the second light absorbing layer includes a metal oxide including the first metal element and the second metal element, and
    the second light absorbing layer has a thickness in a range of about 500 Å to about 10000 Å.

14. The display device of claim 13, wherein the metal oxide included in the second light absorbing layer is represented by the following chemical formula: ABOx,
    wherein A denotes the first metal element, B denotes the second metal element, and x is 1.9 or greater and 2.9 or less.

15. The display device of claim 14, a content of the second metal element in the second light absorbing layer is in a range of about 5 at % to about 50 at % based on a total number of atoms of the first metal element, the second metal element and oxygen (O) in the second light absorbing layer.

16. The display device of claim 12, wherein the second light absorbing layer has a single-layer structure.

17. The display device of claim 13, wherein the metal oxide included in the second light absorbing layer further includes a third metal element of Group 14.

18. The display device of claim 17, wherein the metal oxide included in the second light absorbing layer is represented by the following chemical formula: ABCOx,
    wherein A denotes the first metal element, B denotes the second metal element, C denotes the third metal element, and x is 1.9 or greater and 2.9 or less.

19. The display device of claim 18, wherein a total content of the second metal element and the third metal element in the second light absorbing layer is in a range of about 5 at % to about 50 at % based on a total number of atoms of the first metal element, the second metal element, the third metal element, and oxygen (O) in the second light absorbing layer.

20. The display device of claim 12, further comprising:
    a second capping layer covering the second transparent pattern, and
    wherein the second light absorbing layer is disposed on the second capping layer.

* * * * *